United States Patent
Dunton et al.

(10) Patent No.: US 6,727,107 B1
(45) Date of Patent: Apr. 27, 2004

(54) METHOD OF TESTING THE PROCESSING OF A SEMICONDUCTOR WAFER ON A CMP APPARATUS

(75) Inventors: Samuel V. Dunton, San Jose, CA (US); Ron Nagahara, San Jose, CA (US); Pepito C. Galvez, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/948,808

(22) Filed: Sep. 7, 2001

(51) Int. Cl.[7] .................. G01R 31/26; H01L 21/00; H01L 21/461; B44C 1/22
(52) U.S. Cl. .................. 438/14; 438/8; 438/692; 216/85; 216/86
(58) Field of Search .................. 438/8, 14, 690, 438/691, 692; 216/84, 85, 86; 451/5, 8, 41, 285, 22, 203

(56) References Cited

U.S. PATENT DOCUMENTS

| 5,081,796 | A | | 1/1992 | Shcultz .................. 51/165.47 |
|---|---|---|---|---|
| 5,394,755 | A | | 3/1995 | Sudo et al. .................. 73/861 |
| 5,413,941 | A | | 5/1995 | Koos et al. .................. 437/8 |
| 5,433,651 | A | | 7/1995 | Lustig et al. .................. 451/6 |
| 5,663,797 | A | | 9/1997 | Sandhu .................. 438/16 |
| 5,695,601 | A | * | 12/1997 | Kodera et al. .................. 438/16 |
| 5,916,012 | A | | 6/1999 | Pant et al. .................. 451/41 |
| 6,108,091 | A | | 8/2000 | Pecen et al. .................. 356/381 |
| 6,111,634 | A | | 8/2000 | Pecen et al. .................. 356/72 |
| 6,159,075 | A | * | 12/2000 | Zhang .................. 451/285 |
| 6,217,412 | B1 | * | 4/2001 | Campbell et al. .................. 451/8 |
| 2001/0036805 | A1 | * | 11/2001 | Birang et al. .................. 451/527 |

OTHER PUBLICATIONS

Runnels, S.R.; Kim, I.; Schleuter, J.; Karlsrud, C.; Desai, M.; "Modeling tool for chemical–mechanical polishing design and evaluation," Aug. 1998, IEEE, vol. 11–Issue 3, pp. 501–510.*

* cited by examiner

Primary Examiner—Carl Whitehead, Jr.
Assistant Examiner—David L. Hogans
(74) Attorney, Agent, or Firm—Maginot, Moore & Bowman, LLP

(57) ABSTRACT

A method of testing the processing of a wafer on a CMP apparatus includes processing a control wafer with the CMP apparatus with a predetermined control consumable combination under a predetermined set of control conditions and generating a control data set which describes the processing of the control wafer with the CMP apparatus, the control data set being based upon the control conditions and a removable rate of the control wafer. The method further includes processing a test wafer with a CMP apparatus with a test consumable combination substantially the same as the control consumable combination under a set of test conditions substantially the same as the set of control conditions. The method further includes generating a test data set which describes the processing of the test wafer with the CMP apparatus. The method also includes comparing the test data set with the control data set so as to determine whether the test data set is the same or within a predetermined tolerance range of the control data set.

20 Claims, 6 Drawing Sheets

METHOD OF TESTING THE PROCESSING OF A SEMICONDUCTOR WAFER ON A CMP APPARATUS

TECHNICAL FIELD OF THE INVENTION

The present invention relates generally to a method of testing the processing of a semiconductor wafer on a CMP apparatus, and more particularly to a method of testing the processing of a semiconductor wafer on a CMP apparatus which utilizes the Preston Relationship.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer. In addition, a semiconductor wafer may be polished to remove surface defects such as scratches, roughness, or embedded particles of dirt or dust. Removing these surface defects improves the quality and reliability of the semiconductor wafer.

One system utilized to perform the above described polishing process is known as a chemical mechanical planarization apparatus. Polishing with a chemical mechanical planarization apparatus typically includes positioning a semiconductor wafer to be polished in contact with a polishing pad, and then moving the polishing pad and the semiconductor wafer relative to each other so as to cause material to be removed from the surface of the semiconductor wafer. Polishing with a chemical mechanical planarization apparatus also typically includes the introduction of a chemical slurry onto the surface of the semiconductor to facilitate the removal of material therefrom.

One draw back to utilizing the above described system to polish semiconductor wafers is that the calibration of the chemical mechanical planarization apparatus needs to be checked periodically to ensure that the processing parameters of the apparatus are equal to, or within a predetermined tolerance range of, control parameters. For example, processing parameters of the apparatus which need to be checked periodically include (i) the pressure between the semiconductor wafer surface and the polishing pad and (ii) the relative linear velocity between the semiconductor wafer surface and the polishing pad. If the processing parameters of the apparatus are not equal to, or within a predetermined tolerance range of, predetermined control parameters then the apparatus must be shut down and serviced before additional semiconductors wafers can be polished.

The above described process of periodically checking the processing parameters of the apparatus, and then servicing the apparatus if required, is time consuming and expensive and thus decreases efficiency of semiconductor wafer fabrication process. Therefore, a continuing need exists for a method of testing the processing of a semiconductor wafer on a chemical mechanical planarization apparatus.

SUMMARY OF THE INVENTION

In accordance with a first embodiment of the present invention, there is provided a method of testing the processing of a wafer on a CMP apparatus. The method includes (a) processing a control wafer with the CMP apparatus with a predetermined control consumable combination under a predetermined set of control conditions, (b) performing a control wafer surface removal rate measurement for the control wafer during (a), (c) generating a control data set which describes the processing of the control wafer with the CMP apparatus, the control data set being based upon (i) the control conditions utilized in (a) and (ii) the removal rate measurement of (b), (d) processing a test wafer with the CMP apparatus with a test consumable combination under a set of test conditions, wherein (i) the test consumable combination is intended to be substantially the same as the control consumable combination and (ii) the set of test conditions is intended to be substantially the same as the set of control conditions, (e) performing a test wafer surface removal rate measurement for the test wafer during (d), (f) generating a test data set which describes the processing of the test wafer with the CMP apparatus, the test data set being based upon (i) the test conditions utilized in (d) and (ii) the removal rate measurement of (e), and (g) comparing the test data set to the control data set.

Pursuant to a second embodiment of the present invention, there is provided method of testing the processing of a wafer on a CMP apparatus. The method includes (a) processing a test wafer with the CMP apparatus with a test consumable combination under a set of test conditions, wherein (i) the test consumable combination is intended to be substantially the same as a control consumable combination and (ii) the test wafer is intended to be substantially the same as a control wafer, (b) performing a test wafer surface removal rate measurement for the test wafer during (a), (c) generating a test data set which describes the processing of the test wafer with the CMP apparatus, the test data set being based upon (i) the test conditions utilized in (a) and (ii) the removal rate measurement of (b), and (d) comparing the test data set to a control data set, wherein the control data set describes the processing of a control wafer with the CMP apparatus utilizing the control consumable combination, the control data set being based upon (i) a set of control conditions and (ii) a control wafer surface removal rate measurement for the control wafer.

Pursuant to a third embodiment of the present invention, there is provided an a method of testing the processing of a wafer on a CMP apparatus. The method includes (a) processing a control wafer with the CMP apparatus with a predetermined control consumable combination under a predetermined set of control conditions, (b) performing a control wafer surface removal rate measurement for the control wafer during (a) with an in-situ removal rate monitor, (c) generating a control data set which describes the processing of the control wafer with the CMP apparatus, the control data set being based upon (i) the control conditions utilized in (a) and (ii) the removal rate measurement of (b), (d) processing a test wafer with the CMP apparatus with a test consumable combination under a set of test conditions, wherein (i) the test consumable combination is intended to be substantially the same as the control consumable combination and (ii) the set of test conditions is intended to be substantially the same as the set of control conditions, (e) performing a test wafer surface removal rate measurement for the test wafer during (d) with the in-situ removal rate monitor, (f) generating a test data set which describes the processing of the test wafer with the CMP apparatus, the test data set being based upon (i) the test conditions utilized in (d) and (ii) the removal rate measurement of (e), (g) comparing the test data set to the control data set so as to determine whether the test data set is the same or within a predetermined tolerance range of the control data set; and (h) alerting an operator of the CMP apparatus if the test data set is not the same or not within a predetermined tolerance range of the control data set.

It is an object of the present invention to provide a new and useful method of testing the processing of a wafer on a CMP apparatus.

It is also an object of the present invention to provide an improved method of testing the processing of a wafer on a CMP apparatus.

It is yet further an object of the present invention to provide method of testing the processing of a wafer on a CMP apparatus which enhances the semiconductor wafer fabrication process.

The above and other objects, features, and advantages of the present invention will become apparent from the following description and the attached drawings.

DETAILED DESCRIPTION OF A PREFERRED EMBODIMENT

Figure 1:
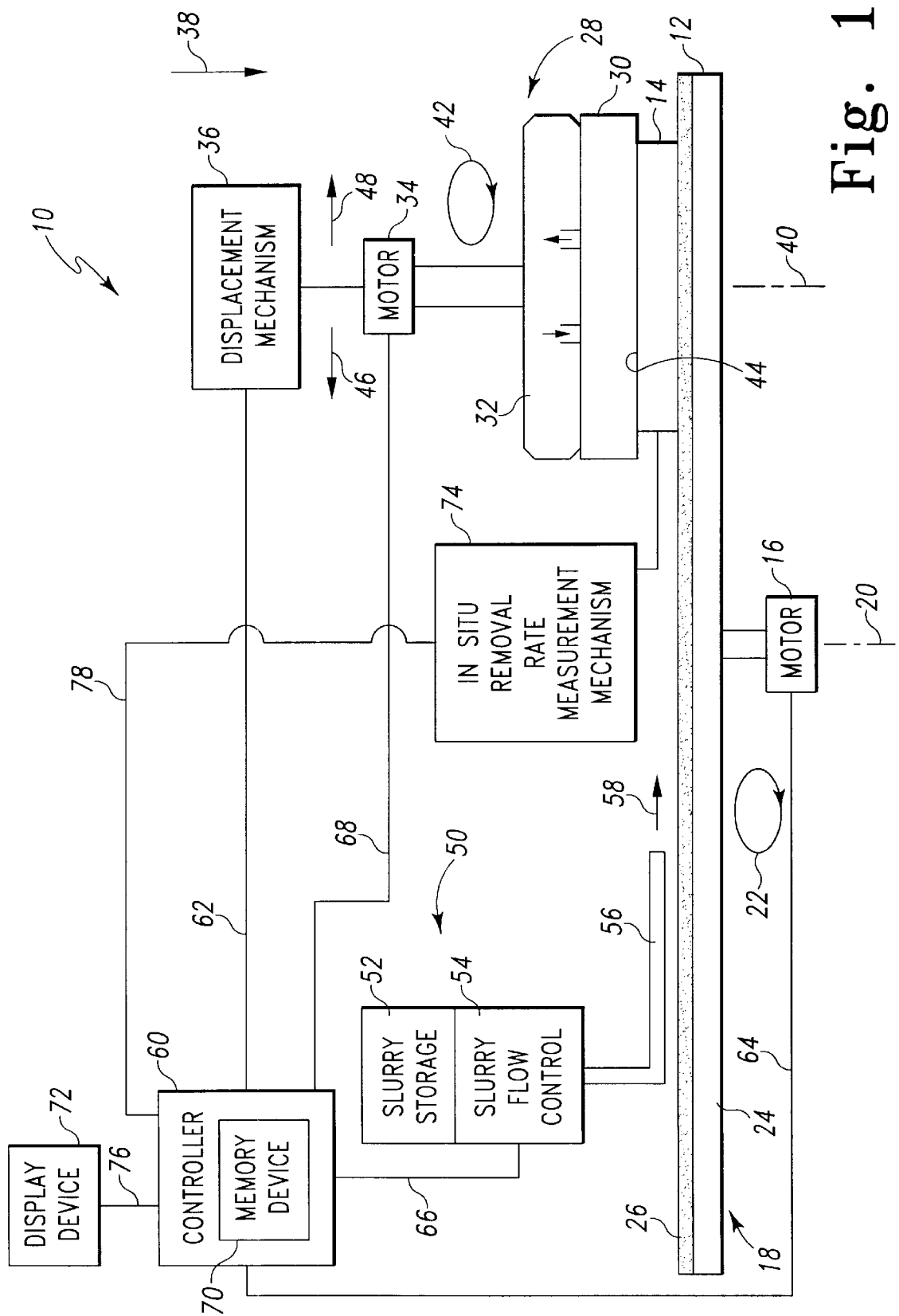
FIG. 1 shows a schematic representation of an exemplary CMP apparatus which can be utilized in the present invention.

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Referring now to FIG. 1, there is shown an exemplary chemical mechanical planarization apparatus 10 (hereinafter referred to as CMP apparatus 10) which is used to polish a front side or surface 12 of a semiconductor wafer 14 (hereinafter referred to as wafer 14). It should be appreciated that examples of polishing platforms which the present invention can be utilized with include, but are not limited to, orbital platforms, linear belt polishing platforms, or rotary platforms. In addition, it is preferable that the present invention be utilized in a polishing configuration which includes an abrasive.

The CMP apparatus 10 includes a platen motor or other drive mechanism 16 and a platen assembly 18. The platen motor 16 rotates the platen assembly 18 about a center axis 20. The platen motor 16 may rotate the platen assembly 18 in a clockwise direction (as shown by arrow 22 of FIG. 1) or in the counterclockwise direction.

The platen assembly 18 includes a polishing platen 24 and a polishing pad 26 mounted on the polishing platen 24. Both the polishing platen 24 and the polishing pad 26 are preferably circular and collectively define a polishing surface against which the surface 12 of the wafer 14 may be polished. Moreover, the polishing pad 26 is typically made of blown polyurethane which protects the polishing platen 24 from chemical slurry and other chemicals introduced during the polishing process.

The CMP apparatus 10 also includes a polishing head assembly 28. The polishing head assembly 28 includes a wafer carrier 30, a cooling mechanism 32, a wafer carrier motor or other drive mechanism 34, and a wafer carrier displacement mechanism 36. The wafer carrier 30, via displacement mechanism 36, applies a controlled, adjustable force in the general direction of arrow 38 in order to press the surface 12 of the wafer 14 into contact with the polishing pad 26 with a predetermined pressure thereby facilitating the polishing of the surface 12 of the wafer 14.

The wafer carrier motor 34 rotates the wafer carrier 30 and the wafer 14 about a center axis 40. The wafer carrier motor 34 may rotate the wafer carrier 30 in a clockwise direction (as shown by arrow 42 of FIG. 1) or in the counterclockwise direction. However, the wafer carrier motor 34 preferably rotates the wafer carrier 30 in the same rotational direction as the platen motor 16 rotates the platen assembly 18 (although the wafer carrier motor 34 may rotate the wafer 14 in the rotational direction opposite the rotational direction of the platen assembly 18 as desired).

The wafer carrier 30 also includes mechanisms (not shown) for holding the wafer 14. For example, the wafer carrier 30 may include a vacuum-type mechanism which generates a vacuum force that draws the wafer 14 against the wafer carrier 30. Once the wafer 14 is positioned on the wafer carrier 30 and held in contact with the platen assembly 18 for polishing, the vacuum force may be removed. In such an arrangement, the wafer carrier 30 may be designed with a friction surface or a carrier pad which engages a back side 44 of the wafer 14 with a carrier ring (not shown). Such a carrier pad, along with the force being applied in the general direction of arrow 38, creates a frictional force between the to wafer carrier 30 and the wafer 14 that effectively holds the wafer 14 against the wafer carrier 30 thereby causing the wafer 14 to rotate at the same velocity as the wafer carrier 30. It should be appreciated that such wafer carriers and carrier pads are of conventional design and are commercially available.

The cooling mechanism 32 counteracts heat generated during the polishing process in order to maintain the wafer carrier 30 at a substantially constant temperature. In particular, the cooling mechanism 32 neutralizes the heat generated due to friction and a chemical slurry reacting with the surface 12 of the wafer 14. Moreover, it should be appreciated that the CMP apparatus 10 may also include an additional cooling mechanism (not shown) for cooling the components of the platen assembly 18 (e.g. the polishing platen 24) during polishing of the wafer 14.

The displacement mechanism 36 selectively moves the wafer carrier 30 and hence the wafer 14 across the platen assembly 18 in the general direction of arrows 46 and 48. Such movement defines a polishing path which may be linear, sinusoidal, or a variety of other patterns. The displacement mechanism 36 is also capable of moving the wafer 14 along a polishing path to a location beyond the edge of the polishing pad 26 so that the wafer 14 "overhangs" the edge. Such an overhanging arrangement permits the wafer 14 to be moved partially on and partially off the polishing pad 26 to compensate for polishing irregularities caused by a relative velocity differential between the faster moving outer portions and the slower moving inner portions of the platen assembly 18. The displacement mechanism 36 is also capable of moving the wafer 14, via wafer carrier 30, in the direction of arrow 38 and thereby urging the surface 12 of the wafer 14 into contact with the polishing pad 26.

The CMP apparatus 10 also includes a chemical slurry system 50. The slurry system 50 includes a slurry storage reservoir 52, a slurry flow control mechanism 54, and a slurry conduit 56. The slurry storage reservoir 52 includes one or more containers for storing slurry. In particular, the slurry storage reservoir 52 contains a chemical slurry that includes abrasive material which facilitates polishing of the surface 12 of the wafer 14. Chemical slurries having such properties are well known and commercially available.

The slurry flow control mechanism 54 controls the flow of slurry from the slurry storage 52, through the slurry conduit 56, and onto the polishing area atop the platen assembly 18. Hence, the slurry flow control mechanism 54 and the slurry conduit 56 selectively introduce a flow of slurry (as indicated by arrow 58) atop the polishing pad 26.

Still referring to FIG. 1, the CMP apparatus 10 also includes a polishing controller 60, such as a computer, for controlling the CMP apparatus 10 in order to effectuate the desired polishing results for the wafer 14. The polishing controller 60 includes a memory device 70 and a display device 72 such as a computer monitor. The memory device 70 has stored therein a plurality of instructions, e.g. processing parameters for the processing a wafer, which when executed by the polishing controller 60, causes the various components of the CMP apparatus 10 to operate in a predetermined manner so as to appropriately polish the surface 12 of the wafer 14.

CMP apparatus 10 also includes an in situ removal rate measurement mechanism 74 for measuring the removal rate of material off of surface 12 (e.g. angstroms/second) of wafer 14 during the processing thereof. Examples of in situ removal rate measurement mechanisms which can be utilized in the present invention are disclosed in U.S. Pat. Nos. 5,413,941, 5,081,796, 5,433,651, 5,663,797, 6,108,091, and 6,111,634 all of which are incorporated herein by reference.

Polishing controller 60 is electrically coupled to the displacement mechanism 36 via a signal line 62 to monitor and controllably adjust the polishing path of the wafer 14 and the speed at which the wafer 14 is moved across the platen assembly 18. Polishing controller 60 also monitors and controllably adjusts the pressure with which the displacement mechanism 36 urges the surface 12 of the wafer 14 into contact with the polishing pad 26 via signal line 62.

Moreover, the polishing controller 60 is electrically coupled to the platen motor 16 via a signal line 64 in order to monitor the output speed of the platen motor 16 and hence the rotational velocity of the platen assembly 18. The polishing controller 60 adjusts the output speed of the platen motor 16 and hence the rotational velocity of the platen assembly 18 as required by predetermined operating parameters.

The polishing controller 60 is electrically coupled to the slurry flow control mechanism 54 via a signal line 66 in order to monitor the flow rate of the chemical slurry onto the polishing pad 26 of the platen assembly 18. The polishing controller 60 adjusts the flow rate of the chemical slurry onto the polishing pad 26 of the platen assembly 18 as required by predetermined operating parameters.

The polishing controller 60 is further electrically coupled to the wafer carrier motor 34 via a signal line 68 in order to monitor the output speed of the wafer carrier motor 34 and hence the rotational velocity of the wafer carrier 30. The polishing controller 60 adjusts the output speed of the wafer carrier motor 34 and hence the rotational velocity of the wafer carrier 30 as required by predetermined operating parameters.

The polishing controller 60 is also electrically coupled to the display device 72 via signal line so as to control the operation of the display device 72. For example, to control what data pertaining to the processing of the wafer 14 with CMP apparatus 10 is displayed on display device 72. Controller 60 is further electrically coupled to in situ removal rate measurement mechanism 74 via signal line 78 so as to control the functioning thereof and receive removal rate data therefrom.

As indicated above, examples of processing parameters which can be stored in memory device 70 include, but are not limited to, the speed at which platen motor 16 rotates platen assembly 18 during the processing of a wafer with CMP apparatus 10. Memory device 70 can also have stored therein the speed at which wafer carrier motor 34 rotates the wafer carrier 30 during the processing of a wafer. Moreover, memory device 70 can store therein the pressure wafer carrier 30 applies in the direction of arrow 38 in order to press the surface 12 of the wafer 14 into contact with the polishing pad 26. Memory device 70 can also store other processing parameters for execution by the polishing controller, for example, instructions for the operation of the (i) slurry system 50 and (ii) displacement mechanism 36. It should be appreciated that memory device 70 can also store data pertaining to the processing of a wafer with CMP apparatus 10. For example, as will be discussed in greater detail below, memory device 70 can store a plurality of removal rates measured by the in situ removal rate measurement mechanism 74.

Furthermore it should be understood that polishing controller 60 is capable of processing data stored in memory device 70 along with data received from in situ removal rate measurement mechanism 74 in order to calculate and display the various relationships between the processing parameters of the CMP apparatus 10 and the removal rate of material from the surface of a wafer being polished. For example, controller 60 can utilize the data stored in memory device 70 and the data received from in situ removal rate measurement mechanism 74 to determine whether the polishing of a wafer, such as wafer 14, by CMP apparatus 10 follows the Preston Relationship.

In particular, the Preston Relationship describes the polishing of a wafer with a CMP apparatus. The Preston Relationship can be expressed as is set forth below:

$$RR = K \times P \times V$$

However, it should be understood that other expressions of the Preston Relationship exist, and these expressions or equations can also be utilized in the present invention. The Preston Relationship states that the removal rate (RR) of surface material during the polishing of a wafer is linearly proportional to the pressure (P) applied between the surface of the wafer and the polishing pad and the relative linear velocity (V) between the surface of the wafer and the polishing pad. K is a proportionality constant which is characteristic of the "particulars" of a specific polishing set up. These "particulars" include, but are not limited to, the polishing medium, the type of abrasives utilized, the material the polishing pad is made from, and the physical and chemical characteristics of the surface material being removed from the wafer being polished. Note that in some particular polishing applications the relation is slightly modified to $RR = K \times P^y \times V^z (y, z \neq 1)$.

It should be understood that the design differences between various CMP apparatus will result in different components of these apparatus being responsible for determining the value of the pressure (P) and velocity (V) parameters. However, as discussed above, the pressure (P) parameter of the Preston Relationship, i.e. the polishing pressure, for the CMP apparatus 10 illustrated in FIG. 1 is determined by the magnitude of the force displacement mechanism 36 urges wafer carrier 30, and thus wafer 14, in the direction indicated by arrow 38. In other words, the magnitude of the force displacement mechanism 36 urges wafer 14 against polishing pad 26. The velocity (V) parameter is based upon the relative rotational speeds of wafer carrier 30 and polishing platen 24, oscillation parameters, and the dimensions of the wafer being polished. The calculation of the pressure (P) and velocity (V) parameters for any CMP apparatus during a polishing process are well within the ability of one of ordinary skill in the art of polishing wafers. Moreover, as previously mentioned the operating parameters of the CMP apparatus 10 are controlled by controller 60. Therefore an operator of the CMP apparatus 10 can enter the desired predetermined pressure (P) and velocity (V) parameters into the controller 60 and the controller 60 will execute instructions such that the CMP apparatus 10 will operate at the desired pressure (P) and velocity (V) or within a predetermined tolerance range of the desired pressure (P) and velocity (V).

It should be appreciated that the above described Preston Relationship can be utilized to provide a method 80 (see FIG. 2) of testing the processing or polishing of a wafer on the CMP apparatus 10 in accordance with the present invention. In particular, as will be discussed in greater detail below, utilizing the Preston Relationship in the method 80 of the present invention ensures that the CMP apparatus 10 processes or polishes wafers in an appropriate manner, i.e. the polishing of wafers with the CMP apparatus 10 obeys the Preston Relationship.

Figure 2:
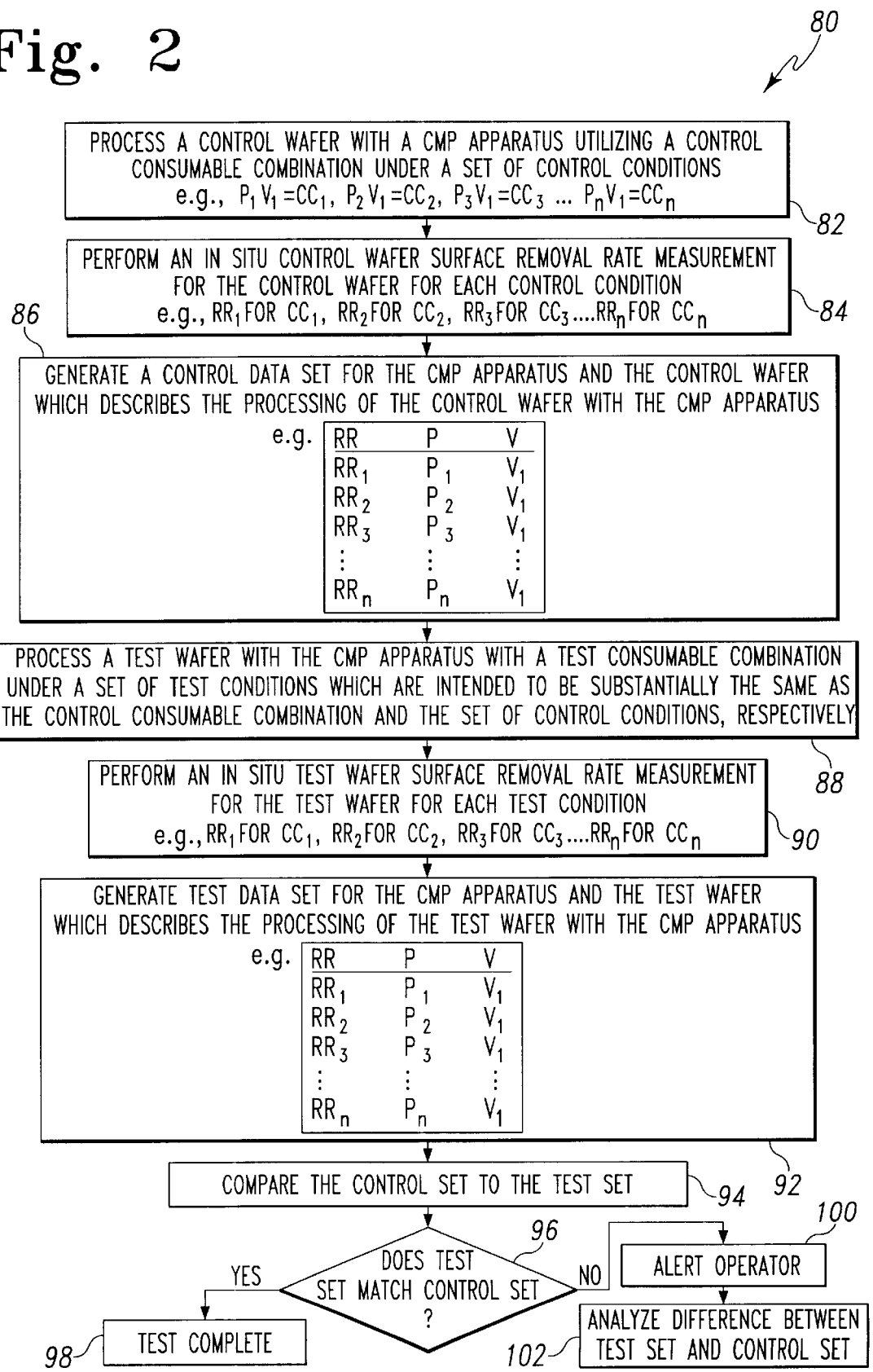
FIG. 2 shows a flowchart of a method of testing the processing of a wafer on a CMP apparatus which incorporates various features of the present invention therein.

As shown in FIG. 2, method 80 begins with step 82 in which a control wafer is processed (polished) with the CMP apparatus 10 utilizing a control consumable combination under a set of control conditions. What is meant herein by a "control wafer" is a wafer having a surface to be polished which has verified known characteristics or a wafer polished with the CMP apparatus 10 so as to generate a control data set of polishing parameters which obey the Preston Relationship to which other data sets (e.g. test data sets of polishing parameters of test wafers) can be compared. What is meant herein by a "control consumable combination" is a particular combination of consumables utilized to polish the control wafer. What is meant herein by "consumables" are components of the CMP apparatus which are consumed during the polishing of a wafer. For example, "consumables" include, but are not limited to, the polishing pad, the abrasives, and the chemicals utilized to polish the control wafer. What is meant herein by "control conditions" are a number of predetermined polishing parameters controlled by polishing controller 60 which define the conditions under which the control wafer is polished. For example, the predetermined polishing parameters controlled by polishing controller 60 which define the conditions under which the control wafer is polished include, but are not limited to, the above discussed pressure (P) and velocity (V) parameters.

It should be appreciated that during step 82 polishing controller 60 systematically changes the polishing parameters during the polishing of the control wafer so as to generate a series of control conditions. For example, the polishing controller 60 will execute an instruction (which can be stored in memory device 70) so that CMP apparatus 10 initially begins to polish the control wafer with (i) a pressure between the polishing pad 26 and the surface of the control wafer being equal to a pressure $P_1$ and (ii) a relative linear velocity between the surface of the control wafer and the polishing pad being equal to a relative linear velocity $V_1$. The above described conditions, i.e. $P_1$ and $V_1$, defines the first control condition, i.e. $CC_1$. After a predetermined time period of polishing the control wafer under control condition $CC_1$ the polishing controller 60 automatically executes another instruction so as to change the pressure between the polishing pad 26 and the surface of the control wafer to a pressure $P_2$ which is different from $P_1$. However, it should be understood that only the pressure is changed and the velocity between the surface of the control wafer and the polishing pad remains substantially constant at $V_1$. The above described conditions, i.e. $P_2$ and $V_1$, defines the second control condition, i.e. $CC_2$. The CMP apparatus 10 then continues to polish the control wafer under control condition $CC_2$ for another predetermined time period until the polishing controller 60 automatically executes another instruction so as to change the pressure between the polishing pad 26 and the surface of the control wafer to a pressure $P_3$ which is different from $P_1$ and P2. However, once again it should be understood that only the pressure is changed and the velocity between the surface of the control wafer and the polishing pad remains substantially constant at $V_1$. The above described conditions, i.e. $P_3$ and $V_1$, defines the third control condition, i.e. $CC_3$. The above process is repeated until the control wafer has been polished under a number of control conditions, e.g. $P_1V_1=CC_1$, $P_2V_1=CC_2$, $P_3V_1=CC_3$ ... $P_nV_1=CC_n$. It should be appreciated that the parameters for each control condition, i.e. the pressure and velocity associated with each control condition, is stored in memory device 70.

It should be understood that while the pressure was changed and the velocity remained constant in the above discussion, it is also contemplated that other combinations of parameters, or varying parameters other than pressure, can be utilized to define the control conditions. For example, the pressure could be maintained at a constant value while the velocity is systematically changed in order to define the control conditions.

In step 84, the polishing controller 60 instructs the in situ removal rate measurement mechanism 74 to measure the removal rate of material from the surface of the control wafer for each control condition, i.e. $CC_1$ through $CC_n$. For example, the removal rate for $CC_1$ is $RR_1$, the removal rate for $CC_2$ is $RR_2$, the removal rate for $CC_3$ is $RR_3$, and the removal rate for $CC_n$ is $RR_n$. It should be appreciated that each removal rate ($RR_1 \ldots RR_n$) measured by the in situ removal rate measurement mechanism 74 in the above described manner is stored in memory device 70.

In step 86 of the method, the polishing controller 60 generates a control data set for the CMP apparatus 10 and the control wafer which describes the processing or polishing of the control wafer with the CMP apparatus with the control consumables under the control conditions. It should be appreciated that the control data set includes each variable of the Preston Relationship, i.e. the removal rate (RR), the pressure (P), and the relative linear velocity (V). Note that (i) each velocity and pressure value for a particular control condition defines a velocity/pressure data pair and (ii) each velocity/pressure data pair is associated with a removal rate which was measured under those particular velocity/pressure parameters. An example of a control data set which can be generated by the polishing controller 60 is as follows:

| RR | P | V |
|---|---|---|
| $RR_1$ | $P_1$ | $V_1$ |
| $RR_2$ | $P_2$ | $V_1$ |
| $RR_3$ | $P_3$ | $V_1$ |
| . | . | . |
| . | . | . |
| . | . | . |
| $RR_n$ | $P_n$ | $V_1$ |

The a control data set for the CMP apparatus 10 is stored in memory device 70 of polishing controller 60.

Figure 3:
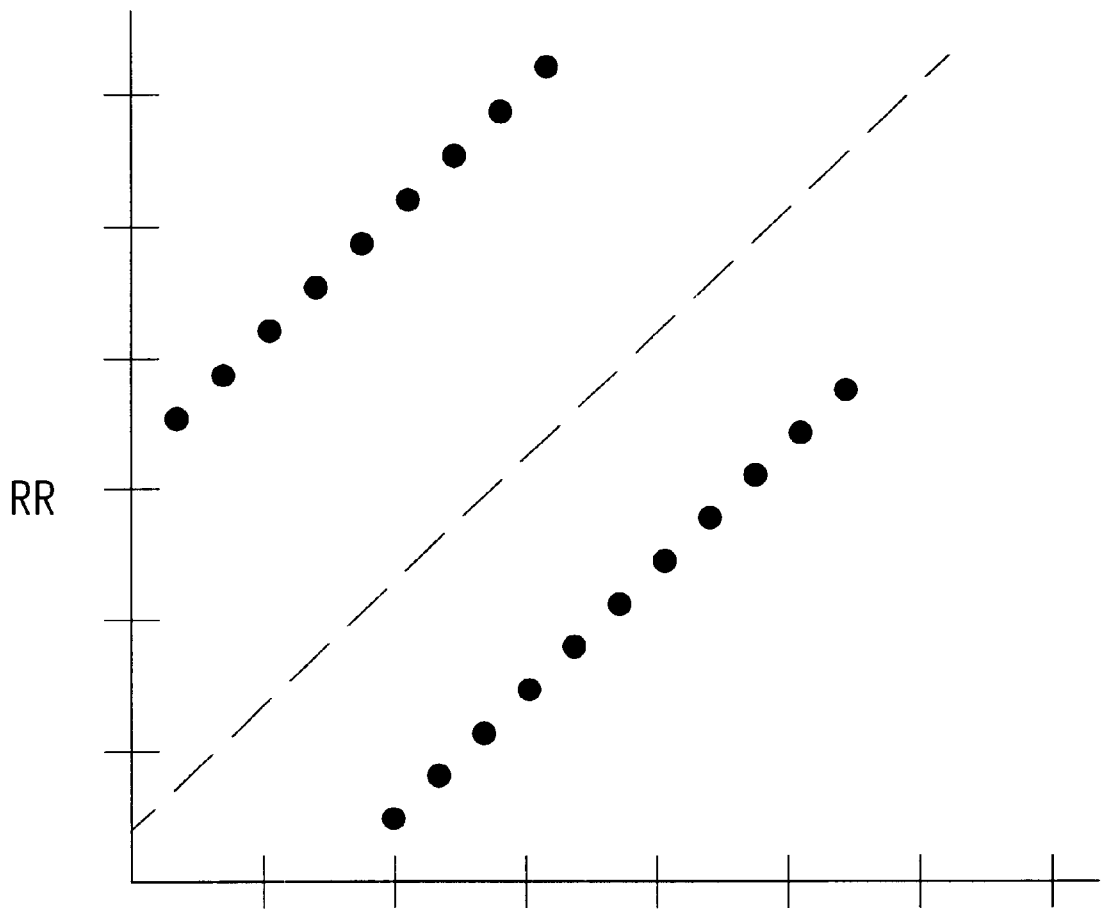
FIG. 3 is an exemplary Preston plot of a prophetic control data set (- - -) and two prophetic test data sets (●)

As discussed above, polishing controller 60 can process the data stored in memory device 70 along with data received from in situ removal rate measurement mechanism 74 in order to calculate and display the various relationships between the processing parameters of the CMP apparatus 10 and the removal rate of material from the surface of a wafer being polished. For example, polishing controller 60 can process the data in the above described control data set and generate a Preston plot which is displayed on display device 72. In particular, a Preston plot is a graphical representation of the data contained in control data set in which the Y axis represents the removal rate (RR) (e.g. in angstroms/second) and the X axis represents the product of the pressure (P) (e.g. psi) multiplied by the velocity (V) (e.g. ft/minute). If the CMP apparatus 10 is operating properly, a Preston plot should yield a substantially straight line, with the slope of the line being equal to the proportionality constant (K) of the Preston Relationship. For example, as shown in FIG. 3, an exemplary Preston plot of a prophetic control data set is shown by the symbols - - - . As will be discussed in greater detail below, a Preston plot of a control data set, such as the one discussed above, can be periodically utilized to test the CMP apparatus and ensure that it is working properly, i.e. to ensure that the CMP apparatus is polishing wafers so that the process obeys the Preston Relationship.

In step 88 of the method, after the control wafer has been removed from the CMP apparatus 10, a test wafer is processed with the CMP apparatus 10. In particular, the test wafer is polished with a test consumable combination under a set of test conditions which are intended to be substantially the same as the control consumable combination and the set of control conditions. In particular, in a similar manner as that described for step 82, the polishing controller 60 systematically changes the polishing parameters during the polishing of the test wafer so as to generate a series of test conditions. For example, the polishing controller 60 will execute an instruction (which can be stored in memory device 70) so that CMP apparatus 10 initially begins to polish the control wafer with (i) a pressure between the polishing pad 26 and the surface of the control wafer which is intended to be substantially equal to the pressure $P_1$ of the control condition utilizing pressure $P_1$ and (ii) a relative linear velocity between the surface of the control wafer and the polishing pad intended to be substantially being equal to the relative linear velocity $V_1$ of the control condition utilizing pressure $V_1$. The above described test conditions, i.e. test $P_1$ and test $V_1$, defines the first test condition, i.e. test $CC_1$. After a predetermined time period of polishing the test wafer under test condition $CC_1$ the polishing controller 60 automatically executes another instruction so as to change the pressure between the polishing pad 26 and the surface of the test wafer to a pressure $P_2$ which is intended to be substantially equal to the pressure $P_2$ of the control condition utilizing pressure $P_2$. However, similar to the procedure described in step 82, it should be understood that only the pressure is changed and the velocity between the surface of the control wafer and the polishing pad remains substantially constant at test $V_1$. The above described conditions, i.e. test $P_2$ and test $V_1$, defines the second test condition, i.e. test $CC_2$. The CMP apparatus 10 then continues to polish the test wafer under the second test condition $CC_2$ for another predetermined time period until the polishing controller 60 automatically executes another instruction so as to change the pressure between the polishing pad 26 and the surface of the control wafer to a pressure $P_3$ which is intended to be substantially equal to the pressure $P_3$ of the control condition utilizing pressure $P_3$. However, once again it should be understood that only the pressure is changed and the velocity between the surface of the control wafer and the polishing pad remains substantially constant at test $V_1$. The above described conditions, i.e. test $P_3$ and test $V_1$, defines the third test condition, i.e. test $CC_3$. The above process is repeated until the test wafer has been polished under a number of test conditions, e.g. test $P_1V_1$=test $CC_1$, test $P_2V_1$=test $CC_2$, test $P_3V_1$=test $CC_3$ . . . test $P_nV_1$=test $CC_n$. It should be appreciated that the parameters for each test condition, i.e. the pressure and velocity associated with each test condition, is stored in memory device 70. It should also be appreciated that, as discussed above, each test condition is intended to be substantially the same as each corresponding control condition and that the test consumable combination is intended to be substantially the same as the control consumable combination.

In step 90, the polishing controller 60 instructs the in situ removal rate measurement mechanism 74 to measure the removal rate of material from the surface of the test wafer for each test condition, i.e. test $CC_1$ through test $CC_n$. For example, the removal rate for test $CC_1$ is test $RR_1$, the removal rate for test $CC_2$ is test $RR_2$, the removal rate for test $CC_3$ is test $RR_3$, and the removal rate for test $CC_n$ is test $RR_n$. It should be appreciated that each test removal rate (test $RR_1$ . . . test $RR_n$) measured by the in situ removal rate measurement mechanism 74 in the above described manner is stored in memory device 70.

In step 92 of the method, the polishing controller 60 generates a test data set for the CMP apparatus 10 and the test wafer which describes the processing or polishing of the test wafer with the CMP apparatus with the test consumables under the test conditions. It should be appreciated that the test data set also includes each variable of the Preston Relationship, i.e. the removal rate (RR), the pressure (P), and the relative linear velocity (V). Note that (i) each velocity and pressure value for a particular test condition defines a velocity/pressure data pair and (ii) each velocity/pressure data pair is associated with a test removal rate which was measured under those particular velocity/pressure parameters. An example of a test data set which can be generated by the polishing controller 60 is as follows:

| Test RR | Test P | Test V |
|---|---|---|
| Test $RR_1$ | Test $P_1$ | Test $V_1$ |
| Test $RR_2$ | Test $P_2$ | Test $V_1$ |
| Test $RR_3$ | Test $P_3$ | Test $V_1$ |
| . | . | . |
| . | . | . |
| . | . | . |
| Test $RR_n$ | Test $P_n$ | Test $V_1$ |

The test data set for the CMP apparatus 10 is stored in memory device 70 of polishing controller 60.

In step 94, the polishing controller 60 compares the test data set to the control data set. In particular, as previously discussed, polishing controller 60 processes the data in the above described test data set and generates a test Preston plot which is displayed on display device 72. The polishing controller 60 then compares the test Preston plot to the control Preston plot. If the CMP apparatus 10 is operating properly and the test consumable combination is substantially the same as the control consumable combination and the test wafer is substantially the same as the control wafer, the test Preston plot should be substantially the same, or within a predetermined tolerance range, of the control Preston plot, e.g. the two curves should have substantially the same slope (the proportionality constant (K)) and be substantially superimposeable. It should be appreciated that there are a number of well know statistical computer programs capable of being executed by polishing controller 60 which can analyze the data from the control data set and the test data set and determine whether the curve generated from the test data set is statistically the same, or within a predetermined tolerance range, of the curve generated from the control data set.

It should also be appreciated that, while the above example describes the processing parameters for the test data set being substantially the same as the processing parameters for the control data set, these processing parameters (i.e. P and V) do not have to be the identical as long as the control test consumable combination is substantially the same as the control consumable combination and the test wafer is substantially the same as the control wafer, under these conditions the Preston plot for the control data set and the test data set should yield the same curves if the CMP apparatus is functioning properly.

The method then advances to step 96 in which the polishing controller 60 instructs the display device 72 to indicate that the test is complete in step 98 if the test data set is the same or within a predetermined tolerance range of the control data set. However, if the test data set is not the same, or within a predetermined tolerance range, of the control data set then the polishing controller 60 instructs the display device 72 to alert an operator of the CMP apparatus in step 100. In addition, as discussed in greater detail below polishing controller 60 can execute additional instructions stored in memory device 70 so as to analyze the differences between the test data set and the control data set in step 102, and suggest possible problems the CMP apparatus may be experiencing based upon comparison of the test data set with a reference data set which is indicative of a particular problem the CMP apparatus may have.

Figure 4:
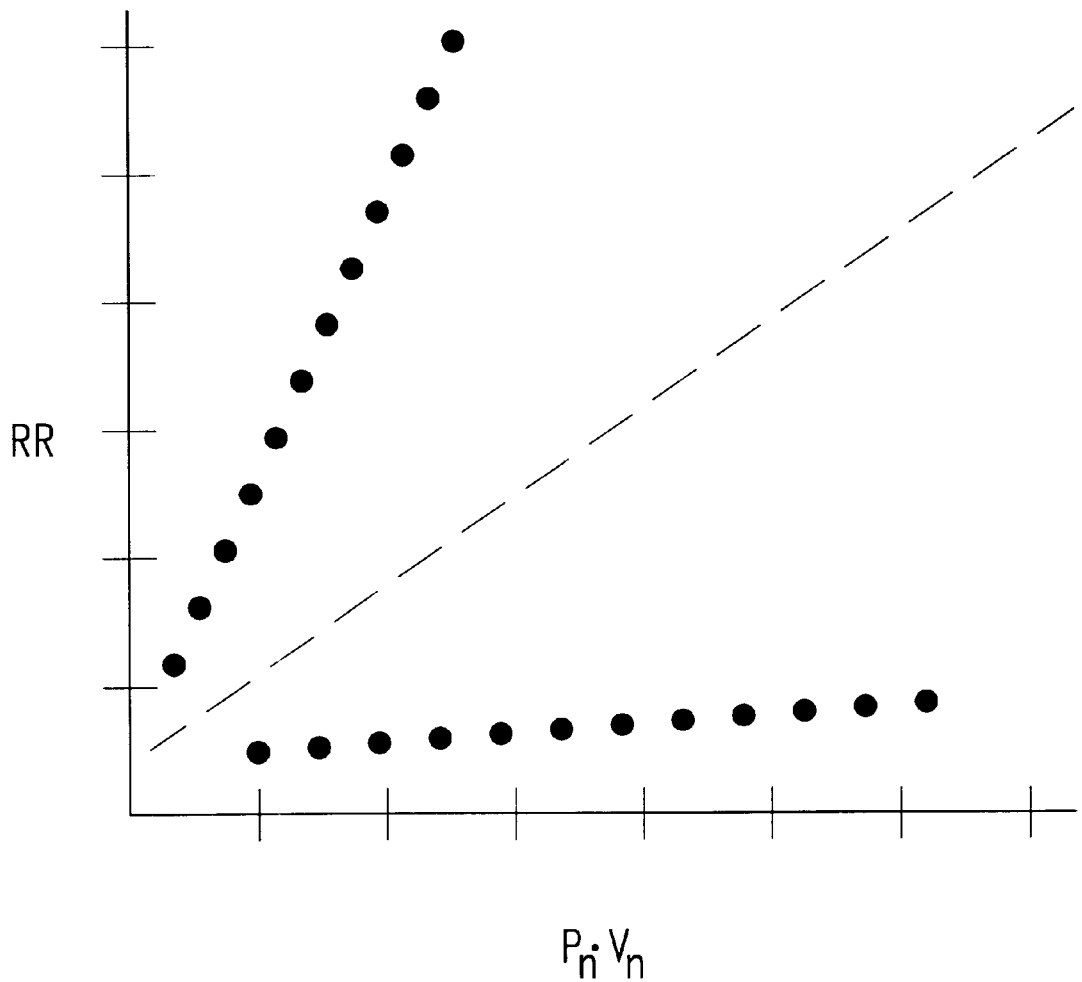
FIG. 4 is an exemplary Preston plot of the prophetic control data set (- - -) of FIG. 3 and two additional prophetic test data sets (●)

For illustrative purposes, FIGS. 3 and 4 show two prophetic examples of Preston plots which may be generated by utilizing the method of the present invention. In particular, these Preston plots may be displayed on display device 72 of the CMP apparatus 10. In FIG. 3, the control Preston plot is represented by dashes ( - - - ). If the CMP apparatus 10 operating properly, the test wafer is substantially the same as the control wafer, and the test consumable combination is substantially the same as the test consumable combination then the test Preston plot should be substantially the same, or within a predetermined tolerance range, of the control Preston plot ( - - - ), e.g. the two curves should have no substantially the same slope (the proportionality constant (K)) and be substantially superimposeable. However, if the CMP apparatus is not functioning properly, for example the displacement mechanism 36 is not functioning properly, then the test Preston plot may result in one of the curves represented by the dots (●). In this case the slopes of the test Preston plots are the same, i.e. the constants (K) are the same, but the test Preston plots are shifted up or down relative to the control Preston plot. In this case, where the slopes of the test Preston plots are the same but the test Preston plots are shifted up or down relative to the control Preston plot, the differences between the test Preston plot and the control Preston plot result indicate that the displacement mechanism 36 of the CMP apparatus 10 is not functioning properly. In particular, the displacement mechanism 36 may not be urging the wafer against the polishing pad 26 with the appropriate pressure, therefore the polishing controller 60 can instruct the display device 72 to display a simple message to an operator of the CMP apparatus 10 stating "check pressure calibration of displacement device". Note that in the examples set for in FIG. 3 the pressure error is substantially constant through out the range of test pressure values tested. However, it is also possible that the pressure error will increase as the test pressure values are increased, and thus the plot of the test data set will not yield a straight line as shown in FIG. 3.

It should also be understood that the above described Preston plot data indicative of a "pressure problem" is stored in memory device 70 as a reference data set and be used to compare with other test data sets to determine if the CMP apparatus 10 is experiencing the same type of "pressure problem" at a later date. Furthermore, a number of reference data sets can be stored in memory device 72, with each reference data set describing the polishing of a test wafer when the CMP apparatus 10 has a reference problem e.g. a problem with the calibration with the pressure or the velocity. Then when a test data set is not the same as a control data set, the polishing controller 60 can compare the differences between the test data set and the control data set with the differences between a number of reference data sets and the control data set and recommend a course of action to address the problem with the CMP apparatus 10.

FIG. 4 is similar to FIG. 3, but shows two test Preston plots represented by the dots (●). These two test Preston plots differ from the control Preston plot ( - - - ) in a way which is indicative of a problem with the test consumable combination, e.g. the test consumable combination does not have the appropriate abrasive or is not at the correct pH. Therefore, in this case, the polishing controller 60 can instruct the display device 72 to display a simple message to an operator of the CMP apparatus 10 stating "check consumable combination". As described above, this type of consumable combination data can also be stored in memory device 72 as a reference data set which describes a reference problem and utilized to suggest possible actions to take to address a problem experienced with the CMP apparatus 10.

Figure 5:
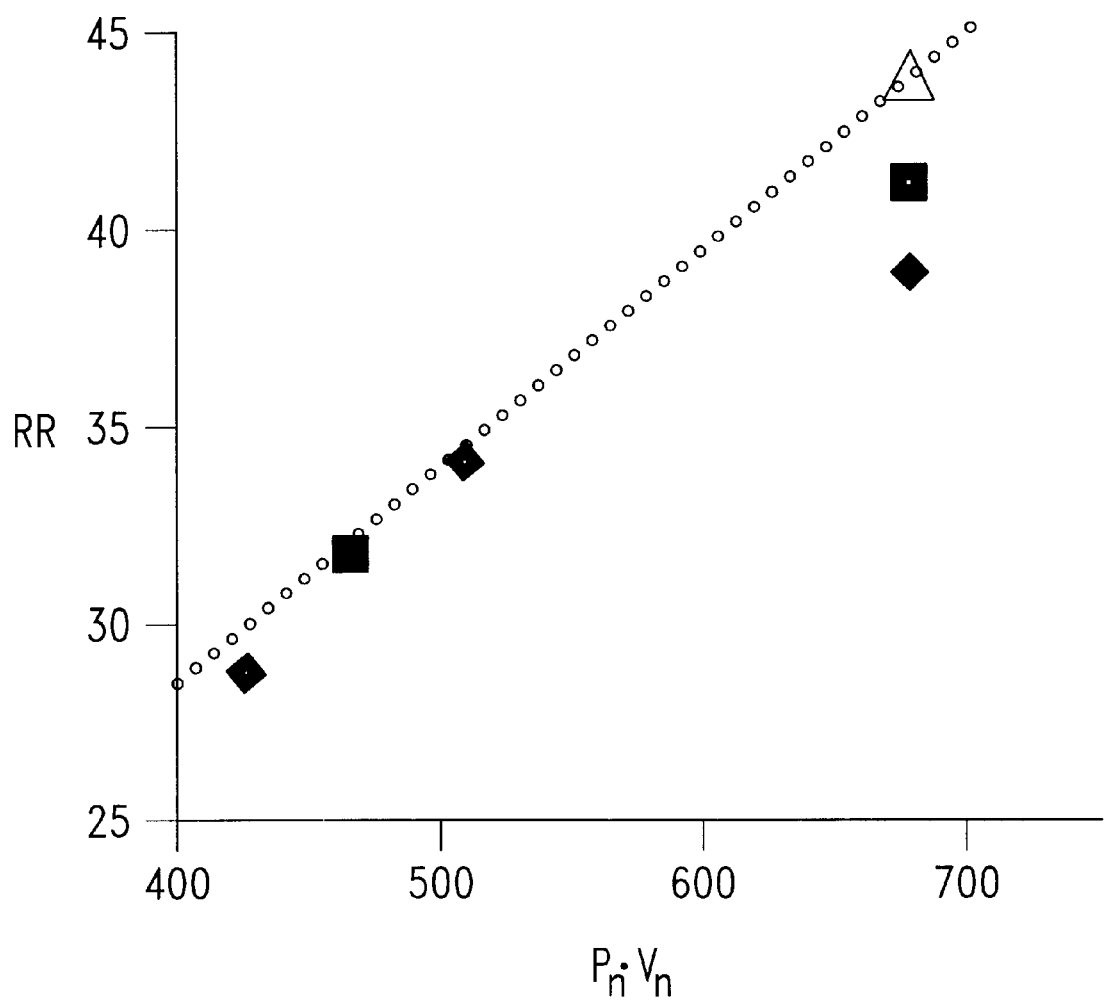
FIG. 5 is an exemplary Preston plot of a control data set (•••), a first test data set (♦), a second test data set (■), and a third test data set (Δ)

Now referring to FIG. 5, there is shown Preston plot of empirical data collected from a CMP apparatus which was tested utilizing the method of the present invention. The Preston plot of the control data set is represented by the (•••), a first test data set is represented by the (♦), a second test data set is represented by the (■), and a third test data set is represented by the (Δ). In this particular example, an operator of the CMP apparatus observed that at higher values of PV the deviation of the test data set from the control data set was different depending upon the backpressure setting of the CMP apparatus. In particular, the back pressure for the curve represented by the (♦) was equal to 2 psi and the back pressure for the curve represented by the (■) was equal to 0.5 psi. The backpressure setting affects the "bow" on the wafer being polished, however, it does not change the Preston relation for a given process. The behavior exhibited in FIG. 2 indicates a problem with the carrier ring (not shown) of the CMP apparatus. Essentially, the pressure on the wafer was applied unevenly because of a warped carrier ring and the uneven effect was exaggerated at higher pressures (deviation from control data set was greater for (♦) at 2 psi than (■) at 0.5 psi. Therefore, the carrier ring was replaced with a new carrier ring and the third test data set (Δ) was collected using the new carrier ring. As shown in FIG. 5, the third data set (Δ) matched the control data set (•••) thereby indicating that the CMP apparatus was repaired.

Figure 6:
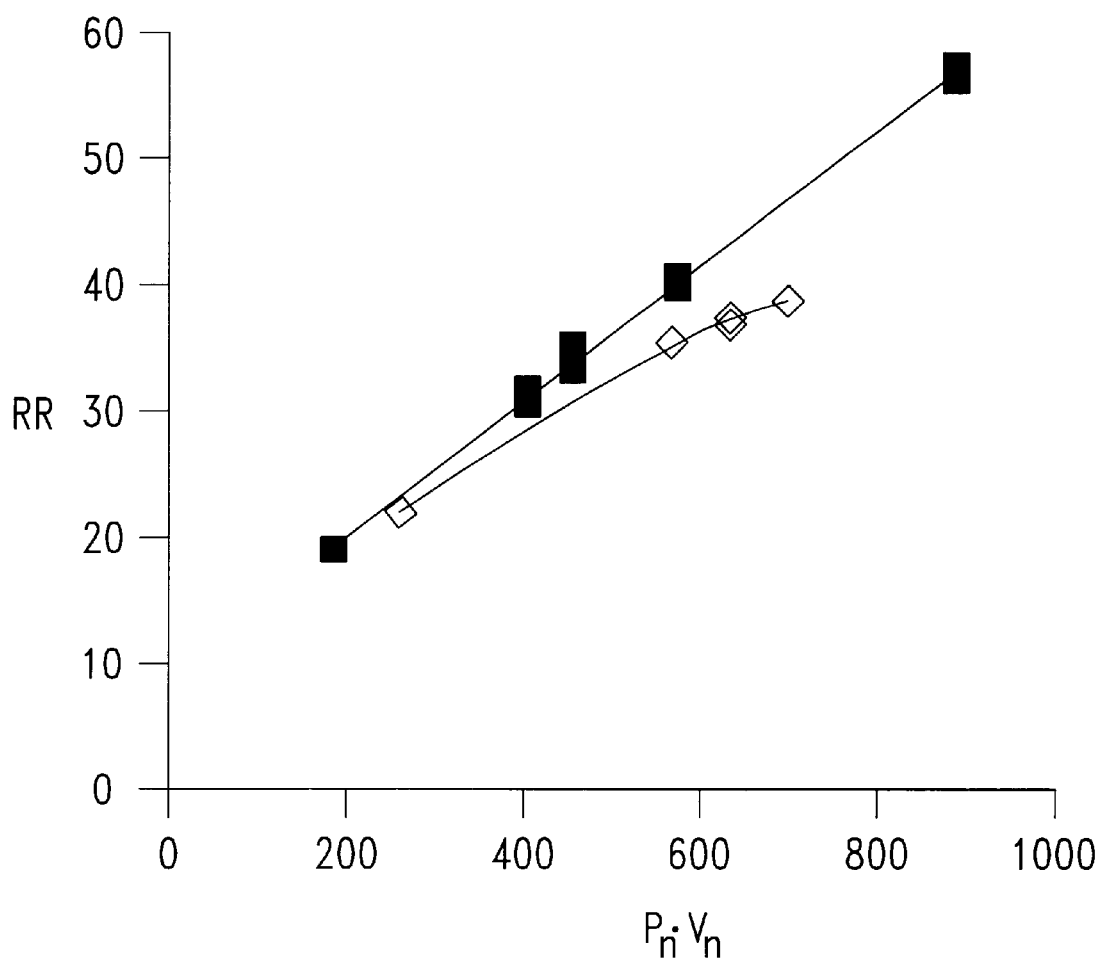
FIG. 6 is another exemplary Preston plot of a control data set (■) and test data set (◇).

Now referring to FIG. 6, there is shown Preston plot of empirical data collected from another CMP apparatus which was tested utilizing the method of the present invention. The Preston plot of the control data set is represented by the (■) and test data set (◇). In this example, an operator of the CMP apparatus observed that at higher pressures (P) of the test data set the removal rate (RR) was low compared to the control data set and thus a plot of the test data set resulted in the curve represented by (◇). It was also determined that if the velocity (V) parameter of a test data set was increased instead of increasing the pressure (P) the plot of this test data set matched the Preston plot of the control data set. This type of behavior indicates that the CMP apparatus could not achieve the desired pressure (P) at the higher settings. This typically occurs if there is a small leak in the pneumatics that control the downforce of a displacement mechanism. Accordingly, the pneumatics that control the downforce of the displacement mechanism were checked and a small leak was found and repaired.

While the invention has been illustrated and described in detail in the drawings and foregoing description, such illustration and description is to be considered as exemplary and not restrictive in character, it being understood that only preferred embodiments have been shown and described and that all changes and modifications that come within the spirit of the invention are desired to be protected.

What is claimed is:

1. A method of testing the processing of a wafer on a CMP apparatus, comprising:
   (a) processing a control wafer with the CMP apparatus with a predetermined control consumable combination under a predetermined set of control conditions;
   (b) performing a control wafer surface removal rate measurement for the control wafer during (a);
   (c) generating a control data set which describes the processing of the control wafer with the CMP apparatus, the control data set being based upon (i) the control conditions utilized in (a) and (ii) the removal rate measurement of (b);
   (d) processing a test wafer with the CMP apparatus with a test consumable combination under a set of test conditions, wherein (i) the test consumable combination is substantially the same as the control consumable combination and (ii) the set of test conditions is substantially the same as the set of control conditions;
   (e) performing a test wafer surface removal rate measurement for the test wafer during (d);
   (f) generating a test data set which describes the processing of the test wafer with the CMP apparatus, the test data set being based upon (i) the test conditions utilized in (d) and (ii) the removal rate measurement of (e); and
   (g) comparing the test data set to the control data set.

2. The method of claim 1, wherein:
   (g) includes determining whether the test data set is the same or within a predetermined tolerance range of the control data set, and
   alerting an operator of the CMP apparatus if the test data set is not the same or not within a predetermined tolerance range of the control data set.

3. The method of claim 1, wherein:
   the control wafer surface removal rate measurement of (b) is performed with an in-situ removal rate monitor, and
   the test wafer surface removal rate measurement of (e) is performed with the in-situ removal rate monitor.

4. The method of claim 1, wherein:
   the predetermined set of control conditions includes (i) a number of pressure values, each pressure value representing the pressure between the control wafer surface and a polishing pad of the CMP apparatus and (ii) a relative linear velocity value associated with each pressure value so as to define a relative linear velocity value/pressure value data pair, each relative linear velocity value representing the relative linear velocity between the control wafer surface and the polishing pad, and
   the control data set includes (i) each relative linear velocity value/pressure value data pair and (ii) a control wafer surface removal rate associated with each relative linear velocity value/pressure value data pair.

5. The method of claim 4, wherein:
   the set of test conditions includes (i) a number of pressure values, each pressure value representing the pressure between the test wafer surface and a polishing pad of the CMP apparatus and (ii) a relative linear velocity value associated with each pressure value so as to define a relative linear velocity value/pressure value data pair, each relative linear velocity value representing the relative linear velocity between the test wafer surface and the polishing pad, and
   the test data set includes (i) each relative linear velocity value/pressure value data pair and (ii) a test wafer surface removal rate associated with each relative linear velocity value/pressure value data pair.

6. The method of claim 5, further comprising:
   (h) generating a control Preston plot with the data contained within the control data set; and
   (i) generating a test Preston plot with the data contained within the test data set;
   wherein (g) includes determining whether the test Preston plot is the same or within a predetermined tolerance range of the control Preston plot, and
   alerting an operator of the CMP apparatus if the test Preston plot is not the same or not within a predetermined tolerance range of the control Preston plot.

7. The method of claim 5, further comprising:
   (j) calculating a control Preston constant $K_1$ with the data contained within the control data set; and
   (k) calculating a test Preston constant, $K_2$ with the data contained within the test data set,
   wherein (g) includes determining whether the test Preston constant $K_2$ is the same or within the a predetermined tolerance range of the control Preston constant $K_1$, and
   alerting an operator of the CMP apparatus if the test Preston constant $K_2$ is not the same or not within a predetermined tolerance range of the control Preston constant $K_1$.

8. The method of claim 1, further comprising:
   (i) comparing the test data set to a reference data set,
   wherein the reference data set contains data which describes the processing of a reference wafer with the CMP apparatus when a reference problem occurs during the processing of the reference wafer with the CMP apparatus.

9. A method of testing the processing of a wafer on a CMP apparatus comprising:
(a) processing a test wafer with the CMP apparatus with a test consumable combination under a set of test conditions, wherein (i) the test consumable combination is substantially the same as a control consumable combination and (ii) the test wafer is substantially the same as a control wafer;
(b) performing a test wafer surface removal rate measurement for the test wafer during (a);
(c) generating a test data set which describes the processing of the test wafer with the CMP apparatus, the test data set being based upon (i) the test conditions utilized in (a) and (ii) the removal rate measurement of (b); and
(d) comparing the test data set to a control data set;
wherein the control data set describes the processing of a control wafer with the CMP apparatus utilizing the control consumable combination, the control data set being based upon (i) a set of control conditions and (ii) a control wafer surface removal rate measurement for the control wafer.

10. The method of claim 9, wherein:
(d) includes determining whether the test data set is the same or within a predetermined tolerance range of the control data set, and
alerting an operator of the CMP apparatus if the test data set is not the same or not within a predetermined tolerance range of the control data set.

11. The method of claim 9, wherein:
the control wafer surface removal rate measurement of (b) is performed with an in-situ removal rate monitor, and
the test wafer surface removal rate measurement of (b) is performed with an in-situ removal rate monitor, and
the test wafer surface removal rate measurement of (e) is performed with the in-situ removal rate monitor.

12. The method of claim 9, wherein:
the set of control conditions includes (i) a number of pressure values, each pressure value representing the pressure between the control wafer surface and a polishing pad of the CMP apparatus and (ii) a relative linear velocity value associated with each pressure value so as to define a relative linear velocity value/pressure value pair, each relative linear velocity value representing the relative linear velocity between the test wafer surface and the polishing pad, and
the test data set includes (i) each relative linear velocity value/pressure value data pair and (ii) a control wafer surface removal rate associated with each relative linear velocity value/pressure value data pair.

13. The method of claim 12, wherein:
the set of test conditions includes (i) a number of pressure values, each pressure value representing the pressure between the test wafer surface and a polishing pad of the CMP apparatus and (ii) a relative linear velocity value associated with each pressure value so as to define a relative linear velocity value/pressure value data pair, each relative linear velocity value representing the relative linear velocity between the test wafer surface and the polishing pad, and
the test data set includes (i) each relative linear velocity value/pressure value data pair and (ii) a test wafer surface removal rate associated with each relative linear velocity value/pressure value data pair.

14. The method of claim 13, further comprising:
(e) generating a control Preston plot with the data contained within the control data set; and
(f) generating a test Preston plot with the data contained within the test data set,
wherein (d) includes determining whether the test Preston plot is the same or within a predetermined tolerance range of he control Preston plot, and
alerting an operator of the CMP apparatus if the test Preston plot is not the same or not within a predetermined tolerance range of the control Preston plot.

15. The method of claim 13, further comprising:
(g) calculating a control Preston constant $K_1$ with the data contained within the control data set; and
(h) calculating a test Preston constant $K_2$ with the data contained within the test data set,
wherein (d) includes determining whether the test Preston constant $K_2$ is the same or within a predetermined tolerance range of the control Preston constant $K_1$, and
alerting an operator of the CMP apparatus if the test Preston constant $K_2$ is not the same or not within a predetermined tolerance range of the control Preston constant $K_1$.

16. The method of claim 9, further comprising:
(i) comparing the test data set to a reference data set,
wherein the reference data set contains data which describes the processing of a reference wafer with the CMP apparatus when a reference problem occurs during the processing of the reference wafer with the CMP apparatus.

17. A method of testing the processing of a wafer on a CMP apparatus, comprising:
(a) processing a control wafer with the CMP apparatus with a predetermined control consumable combination under a predetermined set of control conditions;
(b) performing a control wafer surface removal rate measurement for the control wafer during (a) with an in-situ removal rate monitor;
(c) generating a control data set which determines the processing of the control wafer with the CMP apparatus the control data set being based upon (i) the control conditions utilized in (a) and (ii) the removal rate measurement of (b);
(d) processing a test wafer with the CMP apparatus with a test consumable combination under a set of test conditions, wherein (i) the test consumable combination is substantially the same as the control consumable combination and (ii) the set of test conditions is substantially the same as the set of control condition;
(e) performing a test wafer surface removal rate measurement for the test wafer during (d) with the in-situ removal rate monitor;
(f) generating a test data set which describes the processing of the test wafer with the CMP apparatus, the test data being based upon (i) the test conditions utilized in (d) and (ii) the removal rate measurement of (e);
(g) comparing the test data set to the control data set so as to determine whether the test data set is the same or within a predetermined tolerance range of the control data set; and
(h) alerting an operator of the CMP apparatus if the test data set is not the same or not within a predetermined tolerance range of the control data set.

18. The method of claim 17, wherein:
the predetermined set of control conditions includes (i) a number of pressure values, each pressure value representing the pressure between the control wafer surface and a polishing pad of the CMP apparatus and (ii) a relative linear velocity value associated with each pressure value so as to define a relative linear velocity value/pressure value data pair, each relative linear velocity value representing the relative linear velocity between the control wafer surface and the polishing pad, the control data set includes (i) each relative linear velocity value/pressure value data pair and (ii) a control wafer surface removal rate associated with each relative linear velocity value/pressure value data pair and (ii) a control wafer surface removal rate associated with each relative linear velocity value/pressure value data pair, the set of test conditions includes (i) a number of pressure values, each pressure value representing the pressure between the test wafer surface and a polishing pad of the CMP apparatus and (ii) a relative linear velocity value associated with each pressure value so as to define a relative linear velocity value/pressure value data pair, each relative linear velocity value representing the relative linear velocity between the test wafer surface and the polishing pad, and the test data set includes (i) each relative linear velocity value/pressure value data pair and (ii) a test wafer surface removal rate associated with each relative linear velocity value/pressure value data pair.

19. The method of claim 18, further comprising:

(i) generating a control Preston plot with the data contained within the control data set; and (j) generating a test Preston plot wit the data contained within the test data set;

wherein (g) includes determining whether the test Preston plot is the same or within a predetermined tolerance range of the control Preston plot.

20. The method of claim 18, further comprising:

(k) calculating a control Preston constant $K_1$ with the data contained within the control data set; and (l) calculating a test Preston constant $K_2$ with the data contained within the test data set;

wherein (g) includes determining whether the test Preston constant $K_2$ is the same or within a predetermined tolerance range of the control Preston constant $K_1$.

* * * * *